US008401685B2

(12) United States Patent
Zakirov

(10) Patent No.: US 8,401,685 B2
(45) Date of Patent: Mar. 19, 2013

(54) METHOD FOR REPRODUCING AN AUDIO RECORDING WITH THE SIMULATION OF THE ACOUSTIC CHARACTERISTICS OF THE RECORDING CONDITION

(76) Inventor: Azat Fuatovich Zakirov, Nizhnekamsk (RU)

( * ) Notice: Subject to any disclaimer, the term of this patent is extended or adjusted under 35 U.S.C. 154(b) by 171 days.

(21) Appl. No.: 12/998,417

(22) PCT Filed: Apr. 1, 2009

(86) PCT No.: PCT/RU2009/000156

§ 371 (c)(1), (2), (4) Date: Apr. 18, 2011

(87) PCT Pub. No.: WO2010/114409

PCT Pub. Date: Oct. 7, 2010

(65) Prior Publication Data

US 2011/0196522 A1 Aug. 11, 2011

(51) Int. Cl.
*G06F 17/00* (2006.01)
*H03G 5/00* (2006.01)

(52) U.S. Cl. ........................................... 700/94; 381/98

(58) Field of Classification Search .................... 700/94, 700/98, 118; 381/56, 58, 59, 97, 98, 101, 381/102, 103

See application file for complete search history.

(56) References Cited

U.S. PATENT DOCUMENTS

| | | | | |
|---|---|---|---|---|
| 6,760,451 | B1 * | 7/2004 | Craven et al. | 381/98 |
| 7,302,063 | B2 * | 11/2007 | Albus | 381/86 |
| 2008/0144864 | A1 * | 6/2008 | Huon | 381/305 |

* cited by examiner

*Primary Examiner* — Fan Tsang

*Assistant Examiner* — Eugene Zhao

(74) *Attorney, Agent, or Firm* — Aleksandr Smushkovich

(57) ABSTRACT

The method relates to audio recording reproduction. The method involves testing the features of a three-dimensional sound field using a dual or multi-channel system of spatially distributed channels, transmitting audio signals, and recording the responses in order to determine the differences between the influence of the natural acoustical properties of a room and the influence of the mutual spatial arrangement of audio sources and audio receivers on the characteristics of the sound field. Determining the differences between the features of the three-dimensional sound fields at different recording and reproduction conditions in accordance with this method makes it possible to adjust the parametric data of the tonal characteristics when reproducing an audio recording in order to produce a sound field identical to the sound field of the recording.

2 Claims, 4 Drawing Sheets

METHOD FOR REPRODUCING AN AUDIO RECORDING WITH THE SIMULATION OF THE ACOUSTIC CHARACTERISTICS OF THE RECORDING CONDITION

CROSS-REFERENCE TO RELATED APPLICATIONS

This application is a U.S. national stage application of a PCT application PCT-RU2009-000156 filed on 1 Apr. 2009, whose disclosure is incorporated herein in its entirety by reference.

FIELD OF THE INVENTION

The inventive method concerns and may be applied for determination, medium storage, and re-creation of characteristics of primary attributes of a three-dimensional sound field, such as volume, localization, timbre and dynamics, inherent in subjects of reproduction (original sounds), as well as of spatial features of acoustic environment of the room where, for instance, a musical composition to be recorded is performed during the reproduction of two- and multichannel records of the musical composition in an audio reproduction room.

BACKGROUND OF THE INVENTION

All known methods for recording musical compositions are based on recording of music on some storage medium in a recording room, and on their further reproduction (playback) in rooms, which are different from the recording room and have an acoustic environment varying in an unidentified manner. These methods ignore the influence of the room on the pattern of sounding emitted by a sound source, whereas sounding of any source is to some extent dictated by the spatial characteristics of environment, and always depends on the interaction between all factors of reflection, absorption, interference, dispersion of air acoustic vibrations, etc.; that is to say, since any sound in nature is "unique and inimitable", its reproduction in the form of signal recorded on a digital (or any other) medium in case of reverse transduction to the acoustic form (through electroacoustic transducers) always results in loss of most of the content of primary sound because each transducer alone is a sound source and the signal that it emits is exposed to the environment of the audio room.

In some cases in order to get the desired pattern of sound, the signal is to be subjected to correction, including correction of AFC (amplitude-frequency characteristic), PFC (phase-frequency characteristic), time delays, spectrum modifications, etc. which taken together endow the sounding with the tentative averaged characteristics preset in digital signal processor. That is to say, based on the analysis of acoustic properties of a room by passing unified test signals through the system, which involves "processor (signal synthesizer)—electroacoustic transducer—acoustic environment (room)—acoustoelectric transducer (microphone)—processor (signal response analyzer)" the audio signal is corrected so that to make the sound pattern correspond to one of the proposed types (preset in the signal processor) or to any other type (not specified). Such methods are not able to recreate the sound pattern of original performance of musical programme faithfully because the specific difference in acoustic characteristics between the recording room (primary environment) and reproduction room (secondary environment) is unknown, and there is a record of primary performance only (musical instruments and vocalists may serve as the sound source, while the room may be represented by a studio, concert-hall, opera house, restaurant, pedestrian underpass, etc.) and uncertain acoustic environment of the record reproduction having its own specific nature and features (the sound source is some digital audio system, and unknown room where the record is reproduced).

A related art application RU200411324 relates to the method for reproduction of audio characteristics of a particular environment which implies that at least a part of sound-reflecting and sound-absorbing surfaces in the environment is represented as a virtual "twin" of the environment through their recording by parameterized filters. Each surface has a bank of parameterized filters created with consideration for its sound-reflecting and sound-absorbing characteristics, as well as for relative audio position of surfaces. The banks of parameterized filters are saved and restored when reproducing the audio characteristics of the environment so that to create the virtual twin of the environment. All sound-reflecting and sound-absorbing surfaces of the environment are represented as the virtual twin of the environment. Active sound-reflecting and sound-absorbing surfaces of the environment are represented as the virtual twin of the environment.

First, the above method offers a total or partial representation of the acoustic space as a mathematical model, namely, a parametric description of all or any of surfaces involved in the formation of room acoustics. The new method proposes that the space should be represented by a description of variations of test signals which result from the testing of recording room with the use of a reference signal other than by description of the surfaces, as such. In other words, the new method gives a complex result: an initial response (in an explicit or in a parametric form, herein also called a 'primary response'), which can be represented in any form (as functions, parameters or digital sound signals). Second, the reproduction of audio characteristics of the environment (e.g., a musical room) involves "restoration of banks of parameterized filters so that to ensure the creation of virtual twin of the environment," which means that the parameterized filters being used to describe the surfaces of the environment are restored and apparently repeated during the reproduction. However, filters having parameters of the primary environment cannot be just applied to the audio signal being reproduced in the audio reproduction room, because the audio reproduction room has unknown parameters, which will have an additional effect upon the reproduction quality (performance of the known filter parameters of one room will be necessarily supplemented with the effect of unknown parameters of another room). That is, the room wherein the primary room's audio characteristics are to be reproduced (re-established) also must be tested with the reference signal by the same method used to get the primary response so that to determine the influence of the audio reproduction room on the reference signal.

The results of testing are to be represented as secondary response signals. Further comparison between the secondary response and primary response (i.e. the results of testing of two different rooms by the same signal) makes it possible to define new banks of parameterized filters for the musical signal in order to re-create the desired acoustic conditions (environment) existed during the performance and recording of music in the recording room by making the appropriate calculations. Such new filters can be applied to restore (re-establish) the audio characteristics of the primary room in a different one. In reality, none of the users who got a musical record for reproduction will do that on his own since he doesn't have appropriate equipment.

A prior art application RU2000112549 relates to the method for processing of virtual acoustic environment incorporating surfaces of a transmitter and receiver. The method is distinctive in that the surfaces incorporated in the virtual acoustic environment are described by filters which effect on the audio signal depends on parameters relevant to each filter, and are transmitted from the transmitter to the receiver. The parameters relevant to each filter are coefficients that characterize acoustical reflection and/or absorption and/or transmission of the surfaces. The above method has the drawbacks identical to those of the previous one, that is, it offers a description of space pattern by means of parameterized filters.

Besides, the method involves the steps when the transmitter creates some virtual acoustical environment having the surfaces which are represented by filters which effect on the audio signal depends on the parameters relating to each filter; the transmitter transfers the parameters to the receiver; in order to re-create the virtual acoustical environment the receiver is to make bank of filters which effect the audio signal depending upon the parameters of each filter, and to set up parameters based on the information transferred by the transmitter.

According to the aforementioned method, the transmitter creates surface-representing filters and transfers their parameters to the receiver; the receiver creates filters which parameters depend on the parameters received from the transmitter; that is, the receiver, as in the previous method, ignores the influence of the parameters of its acoustical environment, while this influence must necessarily be taken into account, otherwise proper correction of musical signal is impossible.

BRIEF SUMMARY OF THE PRESENT INVENTION

The inventive method relates to audio recording and reproduction. The method involves testing the features of a three-dimensional sound field using a dual or multi-channel system of spatially distributed channels, transmitting audio signals, and recording the responses in order to determine the differences between the influence of the natural acoustical properties of a room and the influence of the mutual spatial arrangement of audio sources and audio receivers on the characteristics of the sound field. Determining the differences between the features of the three-dimensional sound fields at different recording and reproduction conditions in accordance with this method makes it possible to adjust the parametric data of the tonal characteristics when reproducing an audio recording in order to produce a sound field identical to the sound field of the recording.

According to this method, the determination of distinctions in the primary and secondary spatial sound fields allows for accounting and correction of parametric data of the specificity and distinctive features of the acoustical environment, and their influence on the sound pattern of the sound sources in different conditions for obtaining the secondary sound field parametrically similar to the primary field. During reproduction, this enables obtaining a sound signal authentic to the sound signal previously obtained during the recording.

BRIEF DESCRIPTION OF DRAWINGS

FIG. 3)—an execution of the programme for testing and correction of the audio reproduction room by means of the testing/correction system II; 20—parametric data on the specificity and distinctive features of the influence of acoustical environment on the sound field in the audio reproduction room; 21—comparative analysis of the reference signal, and of the primary and secondary response signals; 22—a determination of function types and a calculation of parameters of the filters for acoustical correction of the reproduction signal on the basis of comparative analysis of the reference signal, and of the primary and secondary response signals; 23—a corrector of the audio signal of the reproduction system (criterion: secondary response signal=primary response signal); 24—the functions of the filters for acoustical correction of the reproduced acoustic signal; 25—relevant parameters (coefficients) of the filters; 26—a set (series) of the primary response signals (Fn) with certain parameters (pFn); 27—parameters of the response signals for the testing system I (for testing the audio recording room); 28—a set (series) of the secondary response signal (Sn) with certain parameters (pSn); 29—parameters of the response signals for the testing system II (for testing the audio reproduction room); 30—comparative analysis of the secondary and primary response signals Sn=Fn?(pSn=pFn?); 31—selection of critical filters, and change of (search for) coefficients (Kn) (filter optimization); 32—acceptance of the coefficients (Kn) of the correcting filter of the audio signal, which provides the optimal signal filtration; 33—a set of optimized digital filters for acoustical correction of the audio signal in the reproduction room (WIIn (Kn)); and 34—a cycle of the testing/correction programme; 35—emitted reference sound test signal; 36—emitted original acoustic signal; 37—reproduced acoustic signal.

Implementation of the Method

Figure 1:
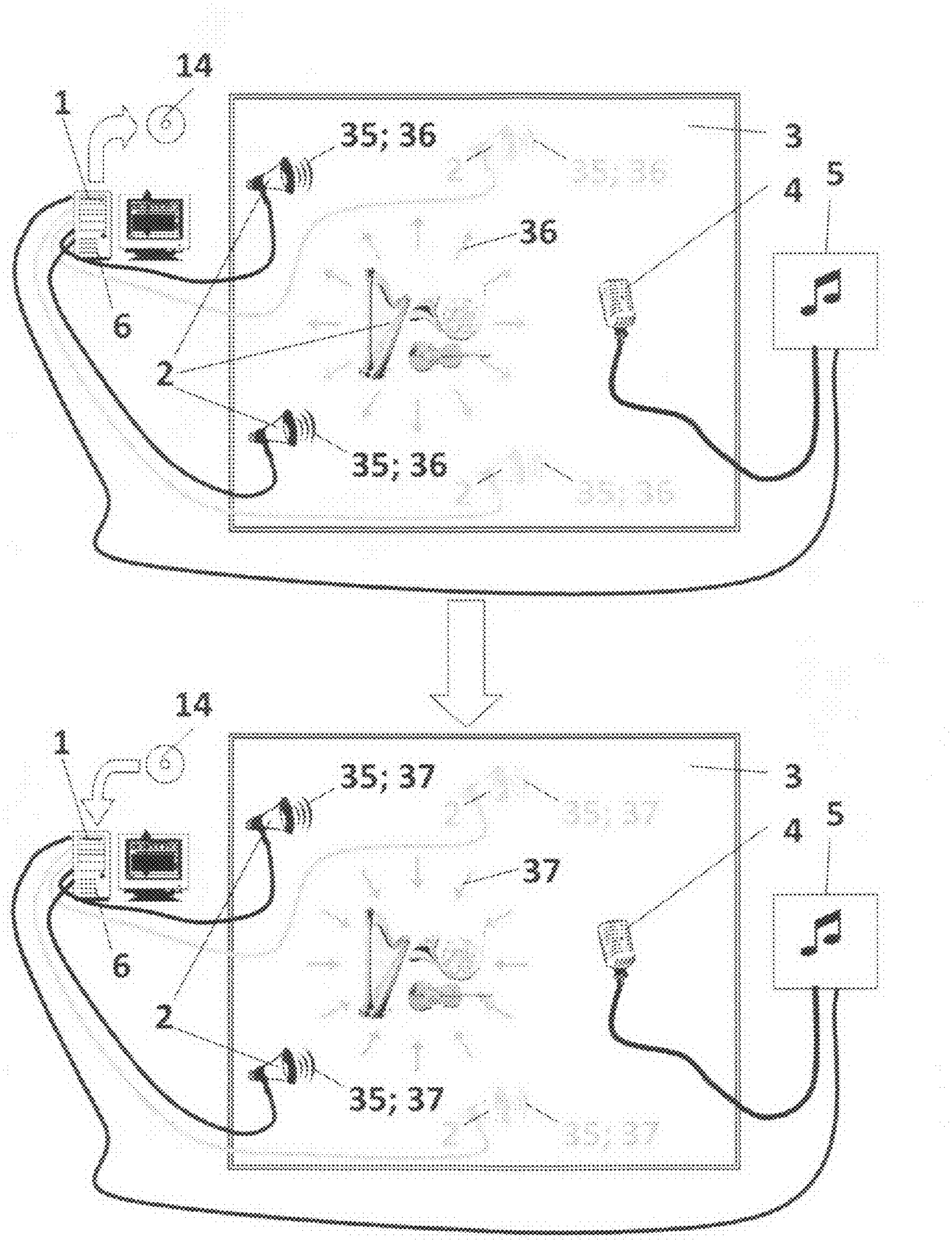
FIG. 1 presents a schematic diagram of a testing system that implements the inventive method, wherein the following reference numerals denote: 1—a source of a reference test signal; 2—an sources of acoustic signal (sources of sound in the acoustic environment, such as electroacoustic transducer, an acoustic musical instrument); 3—a room for emitting an original acoustic signal converted into an recorded audio signal to be tested by the system I or a room for its reproduction of recorded audio signal by converting into an reproduced acoustic signal to be tested by a system II; 4—a microphone to register the response signal; 5—an analyzing receiver of a response signal, calculating describing parameters of set of the primary response signal; and 6—an audio recording (system I for testing the audio recording room)/reproduction (system II for testing/correction the audio reproducing room) system.

The claimed technical result can be obtained by the inventive method for authentic reproduction of a two- or multichannel audio record with simulated re-creation of parameters of acoustic characteristics of a recording environment and with a production of a three-dimensional secondary sound field, having attributes similar to those of a primary sound field, which method is characterized by: —the use of analysis of acoustic properties of an audio recording room and a reproduction room by passing unified test signals through the rooms, and by transmission of non-standard (not preset for testing of the secondary environment or not available for the secondary testing system, but used to test the primary environment) test signals, —the use of testing methods and results of analysis of the acoustic properties of the recording room by means of digital medium of data for the analysis of acoustic properties of the reproduction room, and by—a comparison of the obtained results of analyses and a correction of the reproduced two- and multichannel audio signal, which correction is used to adjust (balance) the parameters of the acoustic properties of the recording and reproduction rooms determined by the aforesaid testing, which is DISTINGUISHED, FIRST, by the use of testing, analysis and evaluation of parameters of energy, space-time and other responses of acoustic properties (acoustic characteristics) of the environment of emitting an original of reproduced objects—primary acoustic signals generated by the sources in the primary environment (audio signal recording, transmission room) and in the environment of reproduction (copying) of the primary sound signals as (in the form of) secondary acoustic signals in the secondary environment where the audio signal is reproduced (in the audio signal reproduction room) by the same process of passing the unified test signals through them, irrespective of their types, via one, two and more separated sound channels for generation of signals of the testing system involved, corresponding to the channels of electroacoustic systems of testing, recording and reproduction that incorporate direct electroacoustic transducers spaced apart in the room to be tested in a certain way, and running in different conditions of combination of isolated, partially joint and completely joint operation, variable as to testing spatial positioning of active channels, to radiate (emit) sound test signals and to produce a sound field using sources which differ in their direction and distance in reference to the reception position for the response signals that can be received by the testing system involved via one, two and more separated sound channels for signal reception (collection, recording) corresponding to the channels of electroacoustic systems of testing, recording and reproduction that incorporate reverse electroacoustic transducers spaced apart in the room to be tested in a certain way, and running in different conditions of combination of isolated, partially joint and completely joint operation to register the relevant test signals intended to determine the response of room to the effect of sound signals by analysis and evaluation of change of test signal type to suit the parameters of acoustic characteristics of the environment in the room to be tested which act on the attributes and features of sound field, such as volume, localization, timbre and dynamics, inherent in subjects of reproduction (original acoustic signals) created by the sound emitting sources in the primary environment and in results of their reproduction (duplication) in the secondary environment (reproduced acoustic signals) within the rooms to be tested by the applicable method;

SECOND, by the way of transmission of the results of analysis and evaluation of acoustic characteristics of the audio recording room in the form of parameters; that is, parametric data on specificity and individual features of the influence of acoustical environment on the sound field of sound emitting sources under the conditions of the audio recording room to be tested; to put it otherwise, by transmission, with no secondary testing system, of:

1) a computer description of the procedure, content, techniques and conditions of testing and correction of acoustic characteristics of the reproduction room, specification of the set of filters used for acoustical correction of two- and multichannel audio signal, including description of list of unified filters and (or) operation methods and functions of not standard filters for correction of each channel according to method of testing and correction in the form of testing programme;

2) list, form (digital representation), if required, and functions of not standard test signals together with the description of correspondence of the test signals with methods and results of testing of the audio recording room—primary response signals—by means of a digital medium of data for testing, analysis and correction of acoustic characteristics of the reproduction room;

THIRD, by comparison of the obtained results of analyses, and by correction of the audio signal of the reproduced two- and multichannel audio record which is to be carry out by adjustment of evaluated parameters of the acoustic characteristics of the audio reproduction environment acting upon the attributes of the secondary sound field to the values of similar parameters of the acoustic characteristics of the audio recording environment acting upon the attributes of the primary sound field so that to adjust the parameters of acoustic characteristics of the recording and of the reproduction rooms determined by testing and to re-create the secondary sound field similar to the primary field, parametrically; in this case, in the opening stage of the implementation of this method, the acoustic characteristics of the audio recording room are tested and evaluated technique-by-technique and condition-by-condition which results in: the primary response signals, parametric data on the specificity and distinctive features of the influence of acoustical environment on the sound field of the sources of test and the original acoustic signals to be recorded in the environment of the recording room, set of filters for acoustical correction of two- or multi-channel audio signal which act upon the parameters to be determined by the appropriate testing method and are used to change parameters of the audio signal during further reproduction of its two- or multichannel audio record according to the parameters of acoustic characteristics of the reproduction room environment; in the room that passed the test, original acoustic signals is emitted, converted into an audio signals, recorded and stored on a digital medium of two- and multichannel audio record together with the parametric data on the specificity and individual features of the influence of acoustical environment on the sound field of sources in the audio recording room, the primary response signals, not standard test signals, specification of the set of filters for acoustical correction of a two- or and multi-channel audio signal and, in case of a non-standard testing, programme code of the procedure, content, techniques, and conditions of technique-by-technique and/or condition-by-condition testing; then, based on the data describing the testing procedure obtained through digital medium or other way of transmission, the reproduction room is subjected to technique-by-technique and/or condition-by-condition testing similar to that of the recording room with the use of the similar testing-and-correction system by passing the unified test signals through the room, which results in: secondary response signals, parametric data on the specificity and distinctive features of the influence of acoustical environment on the sound pattern of emitting sources in the reproduction room for the secondary acoustic signals obtained by reproduction of the two- or/and multi-channel audio record of the primary acoustic signals there; the next stage is determination in the influence of acoustic characteristics and properties of the audio recording and reproduction rooms from the mutual difference between the primary and secondary response signals and from the inconsistency between these signals and the test signals: parameters of the acoustic characteristics of the reproduction room are evaluated with reference to the relevant parameters of the acoustic characteristics of the audio recording room, and, on the basis of the data collected as a result of testing of the audio recording room and obtained with the use of the data storage (medium) or a communication medium by comparison and detection of the difference of testing results between the audio recording room and reproduction room; then the set of filters used for acoustical correction of the acoustic signal during reproduction of two- or multi-channel audio record of the primary acoustic signal is optimized to produce the two- or multi-channel secondary acoustic signal of the type required by the testing-and-correction technique involved: determination of the correction level of each filter required by each testing technique makes it possible to determine the appropriate value of filtration coefficient (factor) of each filter, and comprehensive correction of filters in each reproduction channel based on the correction coefficients (factors) determined on the basis of the results of all tests in accordance with the testing procedure makes it possible to determine the secondary response signal in the given room which is parametrically identical to the primary response signal; that is, the attributes of the sound field of the secondary response signal dependent on the parameters of acoustic characteristics of the audio reproduction room, functions and correction level of the filters are identical to those of the sound field of the primary response signal, which are determined by the parameters of the audio recording room and, accordingly, the secondary acoustic signals (attributes of the secondary sound field) obtained through the reproduction of two- or multi-channel audio record in the secondary environment are authentic (similar) to the primary acoustic signals (attributes of the primary sound field) existing during the recording of the sounds in the primary environment.

Repeatable standard tests of different rooms (primary and secondary environments) can be ensured: first, by testing through passing unified test signals via one, two or more sound channels; and second, by transmission of test signals and primary response signals of computer description of the procedure, content, techniques and conditions of testing; that is to say, with the information on testing techniques and conditions, and on the forms of test signals stored on a certain medium, any testing system having the standard functions can be used to run the standard testing.

The testing of such attributes of a three-dimensional sound field as volume, localization, timbre, and dynamics can be performed by exposure of the room to the sound of a two- or multi-channel sound system through actuation of sound test signals by one, two, or more (depending on the testing technique and condition) sound radiators (loud speakers, such as monitor sound speakers) of separated sound generation channels of this testing system. In this case, the radiators are sound field excitation sources spaced apart in the room to be tested in a certain way; that is, the two- or multi-channel system allows for variants of sound fields with characteristics depending on the location (position) of its radiators, and each radiator is exposed to the local acoustic characteristics of the environment; that is to say, is dependent on different acoustic conditions for the sound-generating sources which makes it possible, with a specific (standard) lay-out arrangement of the radiators (for instance, when the left and right channels of a stereo system are at a distance from the radiators, or when three or more surrounding channels arranged in certain directions about the point of signal recording (audio presentation)—for a multichannel systems and for testing with the use of more than 2 channels), to determine the spatial spread in parameters of energy and space-time responses of acoustic characteristics of the environment that, in the general case, are individual for each channel of the system, since they depend on the geometry of the surroundings, sound-absorbing and sound-reflecting properties of surfaces and other conditions which are individual for each local position in space.

The testing system registers test signal responses using one, two, or more detectors (signal receivers) of separated audio channels corresponding to the channels of electroacoustic systems of testing, recording and reproduction that incorporate reverse electroacoustic transducers and microphones, say, those spaced apart in the room to be tested in a certain way.

The primary and secondary systems of testing, recording and reproduction, singly, make standard testing of different rooms, and perform, their own functions, namely, testing, recording when they are located in the primary room, or testing, correction and reproduction when they are located in the secondary room—in both cases the systems have standard structure, that is, incorporate the same number of audio recording and reproducing channels (involved) arranged in space in accordance with the same diagram. In this case, the number of recording and reproducing channels does not necessarily coincide with the number of channels of reception (collection, recording) of test signal responses. To illustrate, a 6-channel record made with the use of 6 microphones in the room tested by signals from 6 radiators with responses registered by 2 microphones (the optimal option is a stereo microphone) will be reproduced by a 6-channel audio system in another room also tested by test signals from 6 radiators and responses registered by 2 microphones. The number of response registration channels may be 1, 3-6. If a 2 channel record is reproduced each testing system (primary, secondary) must incorporate 1 or 2 (optimal option) response registration channels.

This method allows for repeated saving and transmission of similar results of testing of different rooms as to specific conditions, and for repeatability of testing techniques, objectives and means to make comparative analysis of the room testing results (based on standard tests) and to find a difference of parameters between the primary and secondary fields obtained when different rooms are tested for energy and space-time responses of such attributes as volume, localization, timbre, and dynamics.

The saving and transmission of similar results of testing of different rooms for comparative analysis are effected by: first, passing unified test signals as the testing technique; second, transmission of test signal forms and results of the testing of audio recording room—the primary response signals and the results of analysis and evaluations of energy and space-time responses of acoustic properties of audio recording room; that is, parametric data on the specificity and distinctive features of the influence of acoustical environment on the sound pattern of sound emitting sources in the conditions of the room to be tested, the computer description of the procedure, content, techniques and conditions of the testing of the acoustic properties of the audio reproduction room, and, third, the comparison of the results of room analyses.

In view of the distinctive properties, which determine the nature and sequence of operations: at first, parameters of the acoustic properties of the audio recording room are tested and evaluated, and the original acoustic signals is performed (emitted), converted into an audio signals (and roughly recorded—probably, prior to the testing), and then a two- or multi-channel audio signal of the basic acoustic signals is recorded (saved) on a digital medium in the tested room. In addition to the audio signal, the test signals, the primary response signals, and parametric data on the specificity and individual features of the influence of acoustical environment on the sound pattern of sound emitting sources in the conditions of the audio recording room are recorded (saved).

Thereafter, based on the data obtained through the digital medium, the reproduction room is tested by the same procedure as for the recording room; then the acoustic properties of the audio reproduction room are evaluated in reference to the corresponding parameters of acoustic characteristics of the audio recording room and on the basis of the data obtained by testing of the audio reproduction room and from the digital or communication medium through their comparison and determination of the differences of testing results between the recording room and reproduction room.

This method allows one to correct the reproducing signals to match the required quality, level, and objective of optimization, according to a known reference (pre-set or transmitted) criterion of search, which was not possible with the use of the methods of prior art. Such criterion is represented by parameters of energy and space-time responses of acoustic properties of the environment acting upon the attributes and characteristics of the sound field in the audio recording room, and upon optimization which necessity is dictated by comparative analysis of the room testing results.

The method provides a means for complete and true specifying of certain constraints for repetition of the correction of reproduced acoustic signals by adjustment of the evaluated parameters of the energy and space-time response of the acoustic properties of the environment in the audio reproduction room acting upon the attributes of the secondary sound field to the values of similar parameters of the characteristics of the environment in the audio recording room acting upon the attributes of the primary sound field so that to re-create the secondary sound field similar to the primary field, parametrically, because this method is characterized, first, by transmission of description of the procedure and combination of techniques for correction of characteristics of acoustic properties of the reproduction room, and specification of a set of filters for acoustical correction of a two- or multi-channel audio signal, including a description of list, operation methods and functions of correction filters with the use of a digital medium storing the data required for testing, analysis and correction of energy and space-time responses of the acoustic properties of the audio reproduction room; and, second, by comparison of the results of room analyses and by correction of the reproduced two- or multi-channel acoustic signal, which is to adjust the parameters of acoustic properties of the recording and reproduction rooms determined by the testing.

In view of the distinctive properties, which determine the nature and sequence of operations: at first, parameters of the acoustic properties of the audio recording room are tested and evaluated to identify a set of filters for acoustical correction of a two- or multi-channel audio signal action upon the parameters, which can be identified by the appropriate testing technique and used for the change of parameters of the two- or multi-channel record of primary acoustic signal further reproduced to suit the parameters of energy and space-time responses of acoustic properties of the audio reproduction room, specification of the set of filters is saved on a digital medium, and reproduction room is subjected to testing similar to that of the recording room; then the set of filters for acoustic correction of the two- or multi-channel record of the reproduced primary acoustic signal is optimized to obtain the required type of two and multichannel secondary acoustic signal depending on the testing technique, which uses the relevant set of filters: determination of correction level required by each technique is critical to establish the appropriate filtration coefficient (factor) of each filter for each channel, and, finally, comprehensive correction of filters in each reproduction channel based on the correction coefficients (factors) determined on the basis of the results of all tests in accordance with the testing procedure makes it possible to determine the secondary signal in the given room which is parametrically identical to the primary response signal.

This method makes it possible to re-create (repeat) the characteristic properties of the acoustic environment of the room wherein the original performance and audio recording of musical programme or emission of the original acoustic signals converted into an audio signals took place in unspecified conditions of an audio reproduction room by simulation of characteristics of primary (original) attributes of sound field, such as volume, localization, timbre and dynamics, inherent in subjects of reproduction (original sounds); that is, by creation of parameters of the secondary sound field that repeat energy and space-time properties and parameters of the primary sound field in the audio recording room, which, when the musical programme is reproduced from the digital medium in any other room the acoustic environment of which is objectively different from that of the recording room and imparts its specific character to the sound of sources (musical instruments, voices, sound speakers and other signals emitters), furnishes more close re-creation of the acoustic features of the recording room and primary energy and space-rime status inherent in subjects of reproduction (original sounds) of the musical composition.

This is the generalized technical result of this method provided that the sequence of operations is fully observed; that is, the specified unexpected results are obtained. Partial observance does not produce the result.

The method can be realized on the basis of procedure of preparation for audio recording in the recording or emitting of the original acoustic signals room, medium storage of the audio record and preparation for its reproduction in the reproduction (listening) room.

The method presumes the use of an electroacoustic testing system, a reference test signal (set of signals), a primary response signal, a secondary response signal, and a digital signal processing for analysis and parametric correction of the audio signal in order of testing and calculations for the purpose of evaluation.

The order (procedure) of calculation for the purpose of evaluation (refer to FIG. 4) is established by a microprocessor programme for testing and correction of reproduction room and transmitted to testing system II through the storage medium, along with other data. Accordingly the programme testing system II determines techniques and sequence of testing, analysis of its results, types of correction filters, forms of calculations and presentation of quantities to be measured, and types, intensity and duration of action of test signals. The order (procedure) is established by means of a programme equally suitable for all analyser processors that carry out automatic tests of both recording and reproduction rooms.

The method can be implemented subject to scrupulous attention to the following stage:

Stage 1: Evaluation of Acoustic Parameters of Audio Recording Room

The room prepared for performance of musical composition to be recorded or emission of the original acoustic signals to be converted into an audio signals is tested for acoustic characteristics by a testing system I shown in FIG. 1. The testing system I produces a set (series) of digital reference test signals excited by a reference signal source (1), which reference test signals are then processed substantially by a microprocessor programme (10) that determines the order and techniques of testing of an acoustic space, i.e. a room (3) to be tested (in this case it is a sound recording room) by means of reference audio test signals emitted by an acoustical emitter (sound emitter) (2), that may be a monitor speaker system; the audio test signals cause the room (3) to produce primary response audio signals registered by a microphone (4), that transforms them into primary response (electric) signals further processed by an audio recorder/reproducer system (6). The system (6) includes an analyzing receiver (5) (shown in FIG. 2), that analyzes the primary response signals.

The aforementioned microprocessor programme is a programme that allows for testing of room acoustic properties via various techniques, such as via determination of: —AFC (amplitude-frequency characteristic, —PFC (phase-frequency characteristic), or—group time delay (GTD). To determine the amplitude-frequency characteristic (AFC) of the recording room, the testing system 1 uses a band-pass filter as a filter for acoustical correction and uses audio signals of a certain frequency band as the reference signals, thereby obtaining the primary response signals having amplitudes, whose parameters represent the AFC (amplitude-frequency characteristics of the recording room).

To determine the amplitude-frequency characteristic (AFC) of the reproduction room, the testing system II uses the same reference audio signals for determining the secondary response signals. Then the forms of the amplitude-frequency characteristic (AFC) of two rooms are compared (actually, comparing the parameters (i.e. time values) of primary and secondary response signals). In case of non-correspondence of the AFCs of the sound recording room and the sound reproduction room, the system of testing and correction of the reproduction room (i.e. the testing system II) corrects the amplitude-frequency characteristic (AFC) by changing parameters of the band-pass filter (e.g. changing its transmission gain).

The phase-shift and signal frequency relationship of the phase-frequency characteristic (PFC) is tested for a type and form of the reference signals actuated as periodic or impulse signals. As a result of the testing for phase-frequency characteristic (PFC), the testing system II delays or advances the audio signal to correct the phase-frequency characteristic (PFC). The group time delay (GTD) is tested based on a stepped input signal and is corrected by changing the unit-step response (a transition characteristic) of the filter.

The reference signal, while possessing properties of an sound signal, is in fact cannot be considered as such. It is a synthesized signal form to act on the acoustic environment of room so that to obtain and evaluate the response signal, which can be used to determine particular (specific) parameters of the acoustic environment of the recording and reproduction rooms (3). The set (series) of reference signals is prepared in advance so that its form and amount are adequate to test the rooms via various known techniques (incorporated in the testing programme) employed to evaluate the acoustic properties. For instance, impulse signals are used to evaluate the phase-frequency characteristic (PFC), phase shift, time delay and order of harmonic components; whereas tone signals are used to evaluate the bandwidth, resonance frequencies, damping factor, spectrum analysis and amplitude-frequency characteristic (AFC).

The processor (FIG. 2) of the audio recorder/reproducer system (6) that combines the source of reference signals (1) and the analyzing receiver (5) of the primary response signals carries out the testing of the recording room in accordance with the procedure of calculations (testing programme), according to which the reference signals are transmitted to the acoustical emitter (2), and the primary response signals, recorded by the microphone (4) and digitally represented are received by the analyzer (5). The set (series) of the primary response signals received without any correction of the reference signals represents a basic set (basis) of acoustic characteristics of the recording room, since the response signals result from the impact of the room parameters upon the shape of the reference signals.

As a result of the test carried out via the particular technique, each primary response signal corresponds to a particular reference signal. During the test, the processor compares the reference signals with the primary response signals, and evaluates the changes in the signals for each type of testing for a different frequency time and spectrum responses: amplitude, phase, group delay time, harmonic (sinusoidal) components, spectrum components, damping time, period of transition to a steady state, reverberation, etc. While performing the evaluation, the processor uses the comprehensive testing programme (incorporating various known techniques) and runs the test step-by-step and in different conditions so that to determine numerical, standardized, and comparative values pre-set by the algorithm of testing for digital filters). The digital processing allows determining the parametric values (8) of the acoustic characteristics of the recording room's environment. Hence the analysis of comparison between the reference test signal and the primary response signal allows for an objective numerical determination, with a reasonable accuracy, of specificity and distinctive features of the influence of acoustical environment in the recording or emitting of the original acoustic signals room (for each testing technique), and the most important criteria of correction, and for a selection of correction filters needed for the comprehensive correction of the audio signal.

Figure 3:
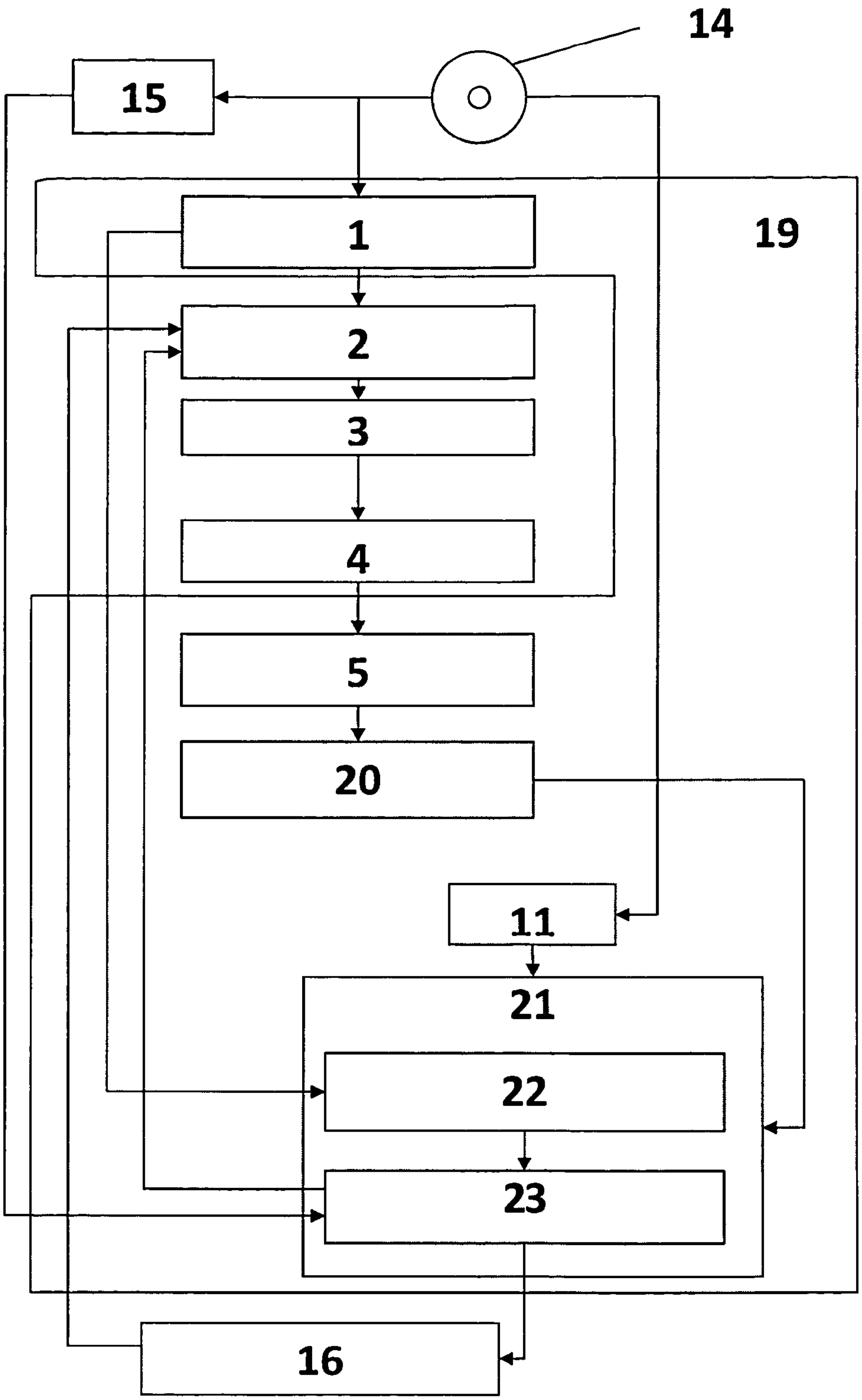

Based on the results of repeated comparative analysis of the recording room, procedures (9) for correction of the testing system are specified; that is, the functions of the correction filters are finally set, the most critical types of filters are selected, and correction parameters and tolerances are established in order to determine the optimal set of correction filters to suit the individual characteristics and the selected criteria, i.e. the parametric values (8). Upon determination of the optimal testing algorithm (procedure), the microprocessor programme (10) for testing the audio reproduction room is launched, that is intended for operating the testing system II (FIG. 3). This test programme (10) prescribes the operation order of the testing system II for testing the reproduction room: —test sequence, techniques (functions and types of digital filters), and procedure for calculation for the purpose of evaluation and comparative analysis of reference signals, and primary and secondary response signals; as well as analytical formulas, transmission functions of the filters, sequence and types of tests and analyses, types of parameters, criteria of testing results, types and procedures for the selection of the correction filters; forms for calculations and presentations of quantities to be measured; types, intensity, and duration of the test signals.

During the tests of the recording room, one obtains the following results:

- the primary response signals, a basic distinguishing characteristic of the recording room as to the reference test signals, which primary response signals are acoustic response signals digitally represented and received by the testing system I without any correction, that is, the recorded changes in reference signals in the recording room on the basis of which the testing system II then determines the parametric data on the specificity and distinctive features of the recording room; each primary response signal relates to a particular testing technique (and is a result of a function of the digital filter applied to the input reference signal used for the testing);
- the set of filters for acoustical correction of an audio signal is a set of correctors (digital filters implemented by the processor) that is selected by the testing system I and enables the testing system II to receive the response signals of a form required by the testing programme; the filter is characterized by a certain digital transfer transition function and a capability of parametrical changing the factors (coefficients) of the function dependent on the specific test technique through the change of the parameters; each such filter is designed for input of a reference test signal, which eventually corresponds to an output signal being the primary response signal;
- the parametric data on the specificity and individual features of the influence of acoustical environment on the sound pattern of sound emitting sources in the recording room, which are parameters of the primary response signals resulted from the evaluation of the recording room obtained from various tests carried out by testing system I, and represented as numerical values related to specific (particular) filters; each such filters is characterized by its own set of parameters of the primary response signal, which set reflects the results of the tests carried out via a particular technique (change in the type, form, duration, and harmonic (sinusoidal) components of the response signal with respect to those of the reference test signals).

The programme for testing and correction of the reproduction room (illustrated on FIG. 4 in detail) is inputted into the system of testing and correction of the reproduction room together (on the same medium) with the audio (musical) signal and with the results of testing of the recording room. The programme completely determines the procedure of testing of the reproduction room: it prescribes the set of tests to be run via different techniques used for similar testing of the recording room and employing the aforementioned digital correction filters and their parameters selected by the recording room testing system (FIG. 2, reference numerals 9 and 10); each such testing technique is associated with a particular digital function of the filter, an output reference test signal (signals), and parametrical data of the filter.

Utilizing the testing-and-correction programme for testing the system, makes it possible to carry out a reliable and specific testing of the reproduction room employing the microprocessor of the testing system II at the testing conditions defined by the testing system I that is to run the test via an analogous technique with the use of the audio signal correction filter that was previously applied by the testing system I to the recording room with the use of an analogous reference test signal but without corrections (only to determine variations of the parameters of the reference signal and the primary response signal which is vital to calibrate the filters for correction of the secondary response signal); to obtain a similar response signal (which is secondary for the reproduction room); to determine the parametric data on the specificity and distinctive features of the influence of acoustical environment on the sound pattern of the sound emitting sources in the reproduction room on the basis of the secondary response signal (to determine variations of the parameters of the reference signal and secondary response signal, and the parameters of the filters); and to make a correction of the reproduction system so that providing the conditions wherein the secondary response signal is substantially identical to the primary response signal. Thus, the simplest example of such operation for the digital first-order low-pass filters refers to “The Semiconductor Circuit Engineering” by U. Titze, K. Schenk, Moscow, Mir, 1982*.

At the second stage is the performing and recording (12) of the musical composition (audio signal) in the tested room (3).

The third stage (FIG. 2) is a saving (recording) (13) of the set (series) of referenced test signals used for testing the recording room and the results (11) of the testing thereof. Namely, the results include: the primary response signals, the set of filters for acoustical correction of the audio signal, the parametric data on the specificity and distinctive features of the influence of acoustical environment on the sound pattern of the sound emitting sources in the recording room, and the programme for testing of the reproduction room. The saving of the above enumerated signals, parameters, and program is performed on a suitable storage medium, or alternatively, a communication system can be used for the storage. These additional data (the reference signals and response signals, set of parameters of acoustic characteristics determined at the first stage; the microprocessor programme that prescribes the procedure of testing of the reproduction room; the subject and order of calculations) are saved in an additional service division (for instance, the “zero” information track) of the digital medium (like CDDA or SACD) in addition to the main audio record. The saving (13) of musical record, parameters of the acoustic conditions in which the record was made, and the testing programme on the same medium (14) makes it possible to save and transfer the fullest information on the aspects of recording, which will be necessary at the stage of preparation for reproduction.

The fourth stage is characterized by evaluation of the acoustic parameters of the reproduction room. The set (series) of reference test signals and the primary response signals, as well as the set of filters for acoustical correction of the audio signal, the parametric values of acoustic characteristics of the audio recording room (filter parameters) determined at the first stage, and the microprocessor testing programme that prescribes the order of calculations with the purpose of evaluation, are transferred (i.e. read from the digital medium (14)) to an audio reproduction processor (19) (in fact, the same audio recorder/reproducer system (6) can be utilized). The processor (19) also makes testing and correction of the reproduction room for the digital signal processing by the testing system II.

The room (3) prepared for reproduction of the recorded musical composition is also tested (stage 1) for acoustic characteristics with the use of the reproduction system (which repeats the pattern of the testing system I at that stage): the source of reference test signal (1), the acoustical emitter (2), the microphone (4) to record the response, and the analyzing receiver (5) of the response signal which is secondary at this that stage. The system of testing of the recoding room and the system of testing and correction of the reproduction room may be represented as two different physical systems, each responsible for the testing programme of the corresponding room.

The audio reproducer of the testing/correction system II includes the processor (19) operating under the programme for testing and correction (FIG. 3), which runs a technique-by-technique and mode-by-mode testing of the reproduction room (3) in much the same way as the testing system I tested the recording room. In this case (FIG. 4) all the testing procedures are repeated successively; that is, all tests performed in the recording room are repeated sequentially with the use of the same set of filters (24) for acoustical correction with similar parameters (coefficients) of filters (25). For each such filter, the programme uses a respective (the same that was used for the testing of the recording room) reference test signal, being the input signal (1) to obtain a digitally represented secondary response signal (28) and to determine parameters (29) of the signal (28). Values (29) of the response signal parameters for the testing system II (reproduction room) will differ from values (27), i.e. those obtained for the testing system I (recording room), since the primary and secondary response signals are not completely identical for the systems I and II.

Hence, by comparing (30) the testing results of the two rooms, the processor determines the required correction level for each filter (31), and establishes appropriate values for the parameters (filtration coefficients) of correction filters (23), depending on the functions of the filters (23). The processor, operating under the testing programme, makes a selection/calculation (31) of the critical types of correction filters; that is, if the response signal obtained with no correction for the parameters of some filter is much different (i.e. exceeds a pre-set difference) from the response signal obtained when testing this filter by the testing system I; or, on the contrary, if the primary and secondary response signals are originally (without any filter correction) equivalent, then the filter is not subject to correction of the audio signal. Thereafter, the processor calculates the parameters (the calculation step is depicted as (31) on FIG. 4) of the filters for acoustical correction of the reproduction acoustic signal based on the comparative analysis (30) of the reference signals, and of the primary and secondary response signals, and then searches for optimal filtration coefficients according to a criterion: Sn=Fn (for an optimal filter with determined filter coefficients).

The set (series) of reference signals (1) and the secondary response signals (28) obtained from an analyzing receiver (18), (shown on FIG. 4) on the basis of the order of calculations, taken together, define the changes made in the test signals by the action of the audio characteristics of the environment in the reproduction room (3) on the shape of the reference signal. The parametric values (29) of the acoustic characteristics (as to the type, shape, and time values of the secondary response signals in relation to the reference signals) are determined by the digital processing. Consequently, the procedure described for stage 1 is completely repeated for the reproduction room. Each testing technique is processed by the testing-and-correction programme as the next cycle.

A comparison between the primary and secondary response signals to the same reference signal makes possible the evaluation of distinctions between the acoustic properties of rooms where the response signals were obtained by the same technique, because their parameters (length, shape, etc.) will differ both from the parameters of reference signals and from each other (due to different acoustic properties).

The fifth stage provides for simulation (modelling) of the acoustic parameters of the recording room (I) in the reproduction room (II). At this stage, the system uses the audio reproducer of the testing/correction system II (19) for the simulation of acoustic parameters of the recording room in the reproduction room, and also uses the reference test signal, primary response signal, secondary response signal, and all corresponding values of the parameters related to two different acoustic environments—the recording room, i.e. (26) for the primary response signals, and (27) for the parameters (time values and functions, (FIG. 4) of the primary response signals), and the reproduction room (28) and (29) respectively, to perform the analysis (21) (FIG. 3) and correction (22) with the aim of signal processing.

Figure 4:
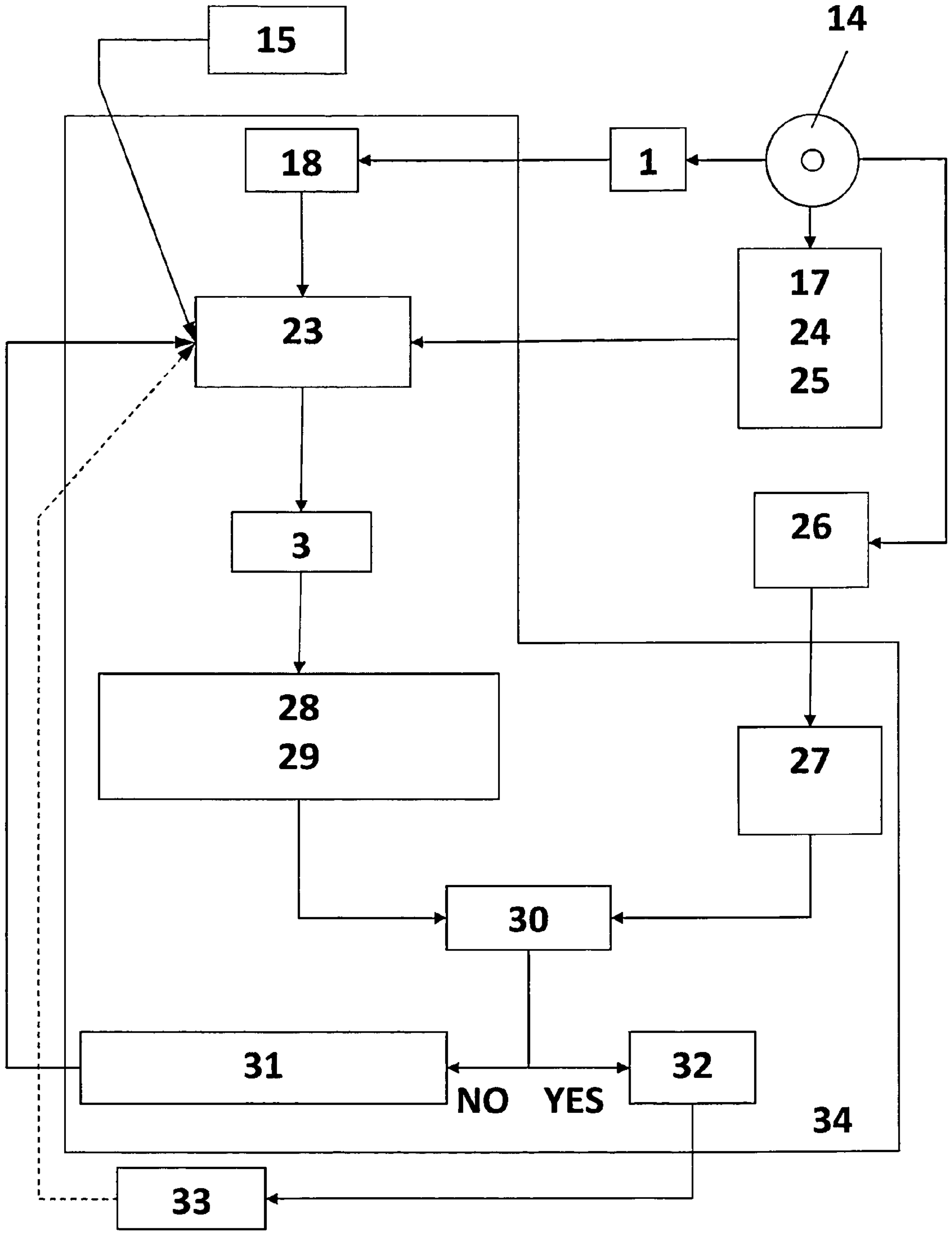
FIG. 4 shows a block diagram of an algorithm of the programme for testing and correction of the reproduction room with the use of results for testing of the recording room, wherein 17—a set of digital filters for acoustical correction of the reproduced acoustic signal converted from the corrected audio signal, and their coefficients; 18—a reference test signal (Rn) with certain predetermined parameters (pRn); 19 (ref.

In accordance with the order of calculations (under the testing/correction programme (19) shown on FIG. 4), the digital signal processor of the reproducer, based on the evaluation of deviations of the shape of response signals from the shape of reference signal, and on the distinction between the primary and secondary response signals, selects the required filters and carries out a calculation of parametric corrections of the audio record signal. The criterion for the audio signal is the identity of the secondary and primary response signals for each testing-and-correction technique. The parametric corrections are calculated for each testing cycle on the basis of the smallest difference between the primary and secondary response signals, and of all parameters for each filter type (see the module (30) on FIG. 4) of characteristics of the two acoustic environments.

In the other words, at this stage, the processor using the reference signal and a pre-set algorithm (testing-and-correction programme transferred via the storage medium) determines the distinction in the action of the two different acoustic environments dependent on the distinction in the primary and secondary response signals, and by correction of each filter brings the sound of reproduction system into the agreement with the sound existed in the recording room, while it was being tested by the reference signal with the use of the testing system I (electroacoustic parameters of the testing system and the audio reproduction system can be different). As described above, it is possible to obtain a subjective similarity of two sound sources (as explained above, the reference signal is input into the electroacoustic emitter/transducer) of the testing system in the recording room and the corrected audio system in the reproduction room.

The testing with the use of a two- or multi-channel testing system allows for accounting the processed spatial attributes of the sound field being tested. In this case, any sound source (acoustic musical instrument, voice) recorded in the recording room, while being reproduced by the audio system corrected in the above manner and located in any room, will have the sound substantially authentic to the original one, with many nuances and keen specific features of the unique event.

The acoustics of the reproduction room is tested (FIG. 4) by the testing/correction system II via all the techniques applied for testing of the recording room. The reproduction room is tested via each technique in turn (by cycles) under the testing programme which prescribes specific testing techniques and requisite testing conditions, filter transfer functions, filter optimization criteria, filter parameters and forms of their presentation. The processor by executing the testing-and-correction programme and running the test via particular technique successively selects the appropriate digital transfer function WIn(Kn) (24) formed by the testing system I with parameters of coefficients Kn (25) from the set of filters (17), and an output signal (series of signals) Rn meant for the type of testing chosen from the set of reference signals [Rn] (1).

The testing-and-correction techniques adopted for testing of recording room employ different digital filters or other numerical methods of formation and transformation of signals performed by the processor under the programme, for example, band-pass filter, rejection (suppression) filter and all-pass filter of the first and second order—responsible for evaluation and correction of AFC (amplitude-frequency characteristic), PFC (phase-frequency characteristic), unit-step (function) responses, group delay time, damping time, period of transition to a steady state, bandwidth, resonance frequencies, etc.

In specific implementation of the inventive method, the testing techniques are selected from considerations of utility: beginning with simple evaluation and ending with correction of AFC (amplitude-frequency characteristic).

The reference signal Rn is a test signal digitally represented. It is meant for a particular technique of testing of both the recording and reproduction rooms; that is to say, is a standard. The same reference input signal can be used for evaluation of parametrical difference of room based on the results of testing of their acoustic conditions via the particular technique. The type and form of the reference signal are dependent on the relevant testing technique. It can be an impulse, tone, semi-tone, or noise signal of a limited or full spectrum. An application of certain reference signal to the particular technique is dictated by the technique specificity, and requirements for accuracy and labour content (requirements) required for the testing results. For the sake of simplicity, the reference signal can be represented in the parametric form of pRn as an array (collection) of parameters and values of signal functions.

Figure 2:
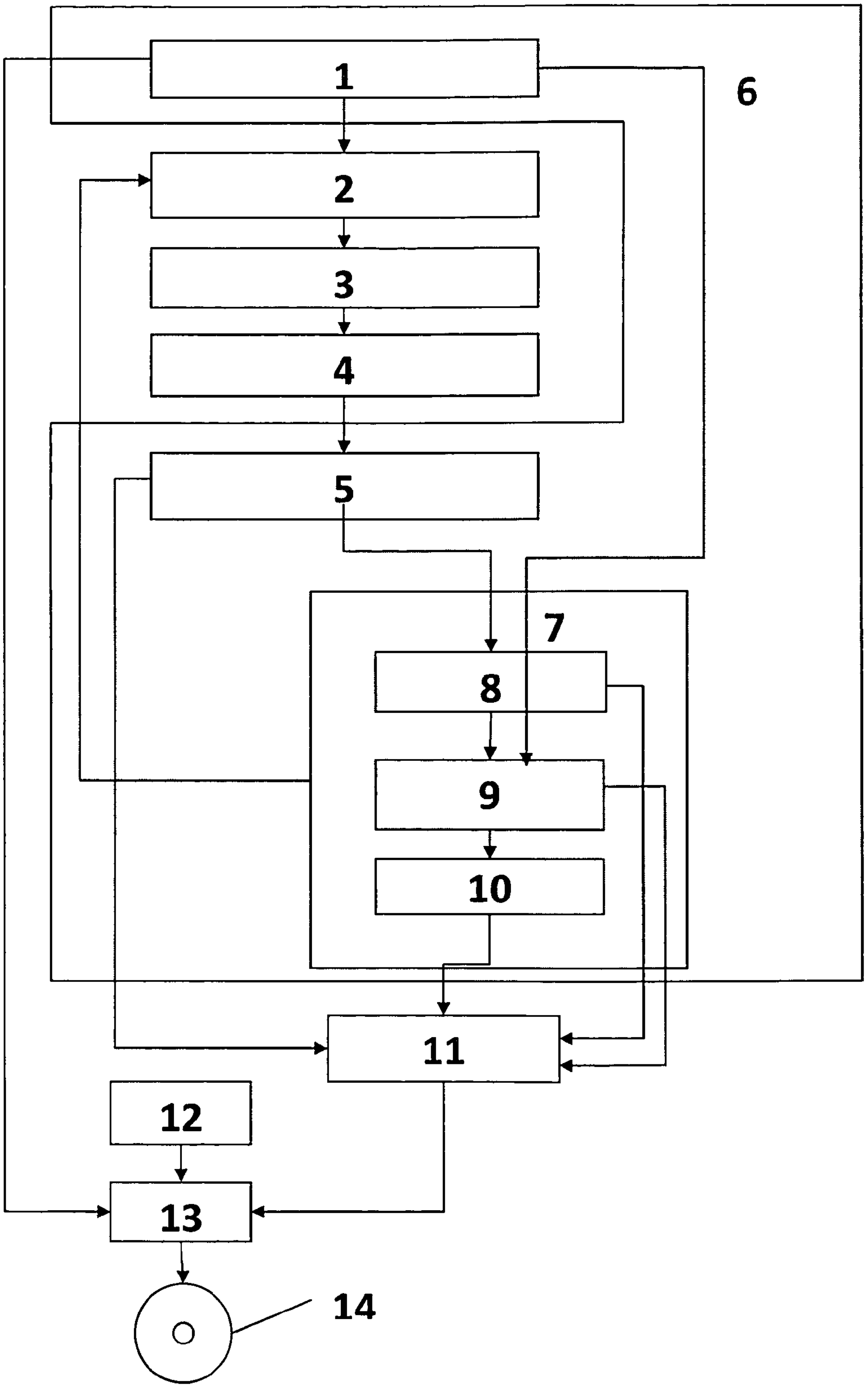
FIGS. 2 and 3 show block diagrams that illustrate stages 1 and 2 of this method; respectively, wherein 7—comparative analysis of the reference signal and the primary response signal; 8—parametric data on the specificity and distinctive features of the influence of acoustical environment on the sound field (parametric data on the specificity and distinctive features of acoustical environment) in the audio recording room; 9—determining functions and describing initial parameters of digital filters for acoustical correction of a reproduced acoustic signal in the audio reproduction room on the basis of the comparative analysis of the reference signal and the primary response signal; 10—preparing test procedures, and producing a test/correction program for testing the acoustical environment and for correction of reproduced acoustic signal in audio reproduction room; 11—results of the testing of the recording room: a set of parameters of the primary response signals, a set of digital filters for acoustical correction of a reproduced acoustic signal in the audio reproduction room, parametric data on the specificity and distinctive features of acoustical environment in the audio recording room, code of the reproduction room testing/correction programme (the testing programme is also recorded on a storage medium to be transferred to a reproduction system (testing system II), which will test its room under this programme); 12—recording an original acoustic signal converted into an audio signal in the recording room; 13—recording the data on a digital information-carrying medium, or transmission of the data onto a communication system (Internet, digital radio broadcasting, etc.); 14—a digital information-carrying medium, or communication system; 15—an audio recording signal; and 16—a corrected audio recording signal.

Each test is to determine a secondary signal Sn (28) and its parametric values pSn (29), which is a result of the response (reaction) of the room under the test to the input test signal Rn, whereas the acoustic parameters of the environment of the recording room are determined by the primary response signal (FIG. 2).

If the secondary response signal Sn is inconsistent with the primary response signal Rn obtained by the testing system I via the same testing technique for the recording room, a transfer function WIn(Kn) of the signal filter (former or transducer) is subjected to correction by changing the parameters of filter Pn, and is transformed into a function Wn(Kn) to be optimized; then the cycle is repeated. With the provision that Sn=Fn (pSn=pFn) (to the proper tolerance) the filter Wn(Kn) is recognized as optimized, and is placed in the set of optimized digital filters (33), which is to say that in this case the response signals to the same reference signal in a different room are deemed similar, which complies with the objective of this method. Results of every subsequent test and correction and the previous results are summed up so that to obtain, eventually, a set of optimized digital filters for acoustical correction of the audio signal in the reproduction room [WIIn (Kn)], which is used for correction of the acoustic signal being reproduced.

The record being reproduced will be perceived as authentic to its performance in the recording room, since all and any sound source (musical instrument, voice, reference signal radiator) recorded by the testing system I in the recording room will be saved on a medium as an audio signal. The sound sources include reference test signals which are used for testing and correction of the reproduction room reasoning from the equality of the response signals to those of the recording room(Sn=Fn).

A transfer function for digital first-order low-pass filters is $W(P)=d_0/(c_0+c_1*P)$ and determines the Laplace transform dependence of the input and output values for unspecified temporary signals.

Application of Z-transform gives a digital transfer function: $W(z)=D_0*(1+z)/(C_0+z)$, where:
Pn—parameter (variable) of filter, Rn—reference signal (input value of filter), $Fn=W(z)/Rn=DI_0*(1+z)/(CI_0+z)/Rn$—primary response signal (output value of the filter in the recording room); $D_0$, $C_0$—filtration coefficients—their values are determined by the filtration parameters; $Sn=W(z)/Rn=DII_0*(1+z)/(CII_0+z)/Rn$—secondary response signal (output value of the filter in the reproduction room).

Form and type of secondary response signal depend on a filtration coefficient of low-pass filter and thus with optimal correction:

$$Sn=Fn \text{ at } DII_0=DI_0+KDn,\ CII_0=CI_0+KCn,$$

where KDn,KCn are filter coefficients W(z), which ensures optimal filtration by this method.

The formulas illustrate the method for frequency-response equalization by the digital first-order low-pass filter, and show that change of filtration coefficients from $DII_0$ and $CII_0$ to KDn and KCn, respectively, can bring the level of the secondary response signal Sn to the level of the primary response signal Fn (i.e. parameters of signals are pF n=pS n) upon completion of the frequency-response equalization by the testing system II. This conclusion is fair for any type of filters with a variable transfer function.

The second example is the all-pass filter $W(z)=(D_0+D_1z+D_2z^2)/(C_0+C_1z+C_2z^2)$—by optimizing coefficients of correction filters it is also possible to obtain phase-shift of secondary response signal equal to the phase-shift of primary signal (with respect to reference signal).

The phase shift is
$\Phi=\mathrm{arctg}((D_1 \sin(2\pi\Omega/\Omega_a)+D_2 \sin(4\pi\Omega/\Omega_a)/(D_0+D_1 \cos(2\pi\Omega/\Omega_a)+D_2 \cos(4\pi\Omega/\Omega_a)))-\mathrm{arctg}((C_1 \sin(2\pi\Omega/\Omega_a)+C_2 \sin(4\pi\Omega/\Omega_a)/(C_0+C_1 \cos(2\pi\Omega/\Omega_a)+C_2 \cos(4\pi\Omega/\Omega_a))),$
where $\Omega=f/f_0$—standardized signal frequency, f—signal frequency, $f_0$—filter shear frequency, and $\Omega_a$—standardized frequency of listening sample which repeats parameters of the testing system.

From the aforesaid, it might be assumed that the aim of optimization of the correction filter of the testing system II is to ensure identity of the secondary and primary response signals, i.e. the testing system achieves (through the searching optimization) for one type of response signals, the primary, for the not corrected system I, and the secondary for the corrected system II, and since these response signals are identical (as to the preset parameters) the sounding (audible response) of each acoustic signal to be reproduced will also be identical (subject to the influence of inherent characteristics of the testing-and-correction system) to the recorded original acoustic signal pattern in the recording room (one test signal in different conditions produces a response signal with similar parameters). Thus, any source, which emits a acoustic signal in the recording room, can be identically reproduced in another room.

This inventive method can be implemented in the audio recording (emitting of the original acoustic signals converted into an audio signals) room (3) with the use (FIG. 1) of the audio recording/reproduction system (6) and a similar system located in the reproduction room, which can consist, for example, of a computer with an audio card complete with a microphone (4), an acoustical emitter (2) based, for example, on dynamic loudspeakers, a source of reference test signal (1) like CD-audio medium, and an analyzing receiver (5) of response signal which can be a software recorded on a suitable medium and its functions can be performed by the computer, or can be a multi-channel recorder like MOTU 828 mkII USB 2.0 (MOTU), MOTU Traveler FireWire, etc.

The invention claimed is:

1. A method for testing a three-dimensional primary sound field in an audio recording room using a dual or multi-channel system of spatially distributed channels, obtaining characteristics of the primary sound field, and reproducing a three-dimensional secondary sound field essentially identical to the three-dimensional primary sound field in a reproduction room, said method comprising the steps of:

(a1) in said audio recording room, emitting an original acoustic signal converted into an audio signal; providing a reference digital signal converted into a sound test signal emitted in said audio recording room; said reference digital signal possesses predetermined describing parameters; obtaining a set of primary response signals for each channel in said audio recording room;

(a2) calculating describing parameters of said set of primary response signals;

(a3) comparing said predetermined describing parameters of said reference signal and said describing parameters of said set of primary response signals;

(a4) obtaining and evaluating parametric data on the specificity and distinctive features of acoustical environment in the audio recording room;

(a5) determining functions and describing initial parameters of digital filters for acoustical correction of a reproduced acoustic signal in the audio reproduction room based on the steps (a3, a4);

(a6) preparing test procedures, and producing a test/correction program for testing the features of acoustical environment and for correction of said reproduced acoustic signal in said audio reproduction room;

(a7) recording to a digital medium and/or transmitting through a communication system said audio signal and at least the following data for testing the features of acoustical environment in the audio reproduction room and for correcting said reproduced acoustic signal: said describing parameters of said set of primary response signals according to the step (a2); said parametric data according to the step (a4);

(b1) in said audio reproduction room, retrieving said audio signal and the data according to the step (a7); running the test/correction program according to the step (a6);

(b2) providing said reference digital signal according to the step (a1), converted into a sound test signal emitted in said audio reproduction room, obtaining a set of secondary response signals in said audio reproduction room for each channel identical to said channels according to the step (a1) in said audio recording room;

(b3) calculating describing parameters of said set of secondary response signals;

(b4) comparing said parameters of the reference digital signal according to the step (a1) and said describing parameters of said set of secondary response signals;

(b5) obtaining and evaluating parametric data on the specificity and distinctive features of acoustical environment in the audio reproduction room;

(b6) using said reference digital signal according to the step (a1), and said set of digital filters for acoustical correction determined on the step (a5) for producing a corrected reference digital signal, further converted into a sound test signal emitted in said audio reproduction room;

(b7) comparing the parameters of said primary response signal and said secondary response signal relatively to said reference digital signal;

(b8) determining and assigning parameters of said filters for acoustical correction of said sound test signal emitted by each channel in the audio reproduction room according to the step (b6), based on the results of said comparing of the step (b7), to obtain the parameters of said set of secondary response signals to be substantially identical to said parameters of said set of primary response signals obtained on the step (a2);

(b9) optimizing said parameters of filters for acoustical correction obtained on the step (b8) and correcting said audio signal by means of said filters comprehensive in all channels for modelling the parametric data according to the step (a4) in said audio reproduction room, under the following condition: said parametric data according to the step (b5) to be substantially identical to said parametric data according to the step (a4); and (b10) reproducing the corrected said audio signal as a corrected reproduced acoustic signal in said audio reproduction room, wherein said corrected reproduced acoustic signal is substantially identical to said original acoustic signal according to the step (a1).

2. The method according to claim 1, wherein the step (a7) further includes recording and/or transmitting through a communication system the following data for testing the features of acoustical environment in the audio reproduction room and for correcting said reproduced acoustic signal: said describing parameters of the reference digital signal according to the step (a1), said functions and initial parameters of digital filters according to the step (a5), and said test/correction program according to the step (a6).

* * * * *